(12) United States Patent
Johnson

(10) Patent No.: US 6,570,393 B2
(45) Date of Patent: *May 27, 2003

(54) TEST APPARATUS IMPROVED TEST CONNECTOR

(75) Inventor: David A. Johnson, Wayzata, MN (US)

(73) Assignee: JohnsTech International Corporation, Minneapolis, MN (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/156,128

(22) Filed: Sep. 17, 1998

(65) Prior Publication Data

US 2002/0003424 A1 Jan. 10, 2002

Related U.S. Application Data

(60) Provisional application No. 60/059,305, filed on Sep. 17, 1997.

(51) Int. Cl.[7] .............................................. H01H 31/04
(52) U.S. Cl. ..................................................... 324/538
(58) Field of Search ................................ 324/765, 754, 324/538, 757, 755, 761, 758; 439/620, 66, 71, 74, 330, 487, 62, 636, 70

(56) References Cited

U.S. PATENT DOCUMENTS 5,362,241 A * 11/1994 Matsuoka et al. ............ 439/66
5,872,458 A * 2/1999 Boardman et al. .......... 324/758

* cited by examiner

Primary Examiner—Safet Metjahic
Assistant Examiner—Etienne P LeRoux
(74) Attorney, Agent, or Firm—Nawrocki, Rooney & Sivertson, P.A.

(57) ABSTRACT

An improvement to contacts for automatic test apparatus used in the testing of semiconductors. At least two contacts with first and second ends for engaging test points of a device under test (DUT) extend the first end different distances toward the DUT. The test apparatus is arranged to support and carry a DUT at a predetermined rate toward the two contacts. The contact with the greatest first end extension, which contacts the DUT first, has the second end connected to ground and the other contact has the second end connected to a test voltage. Each first and second end of said contacts have support means arranged to permit the ends to deflect a predetermined distance under a predetermined force. This permits the apparatus to engage both ends of both contacts at predetermined contact forces. A plurality of sets of contacts with a given extension and/or a plurality of different extensions for sets of contacts can also be used.

5 Claims, 1 Drawing Sheet

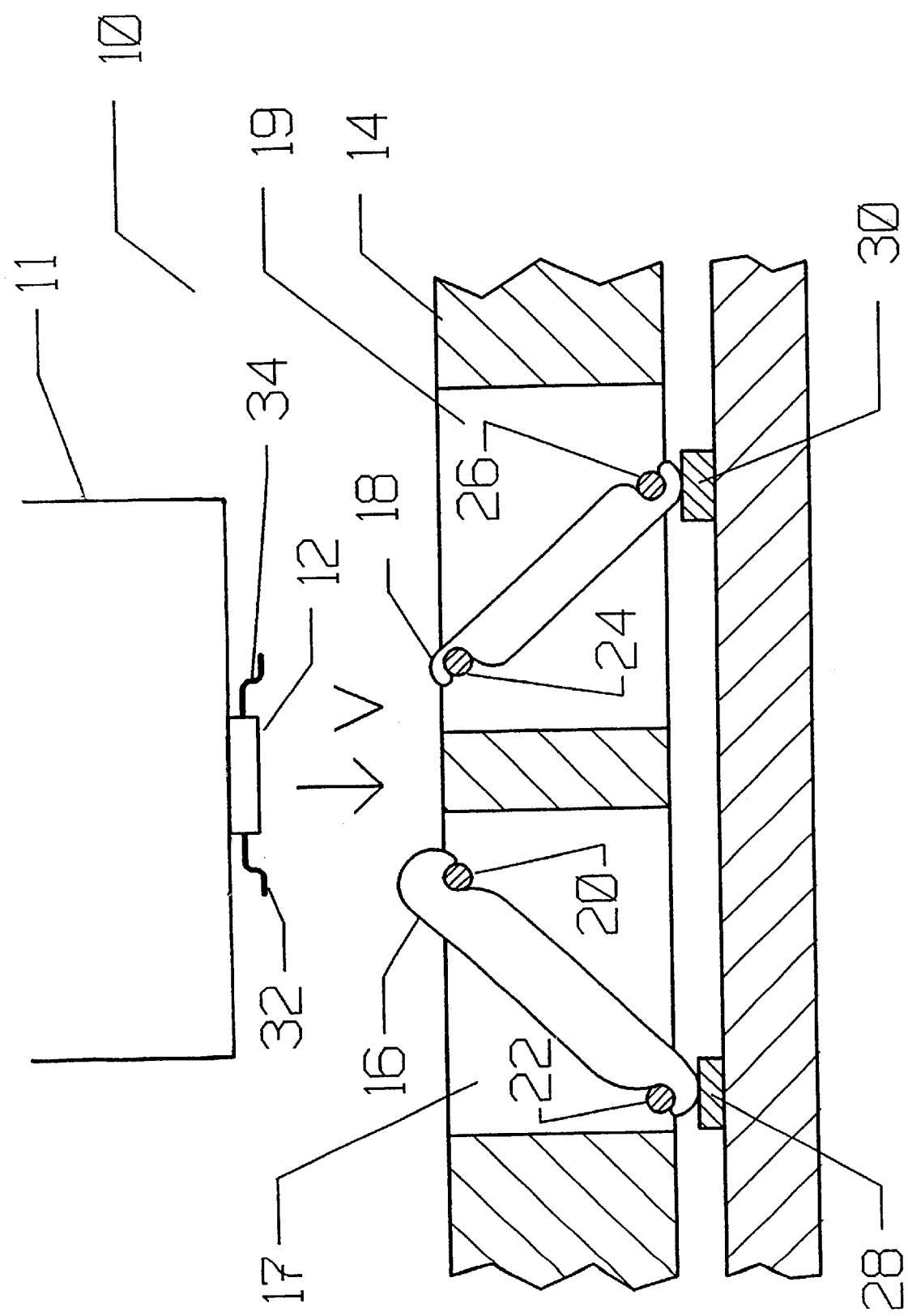

TEST APPARATUS IMPROVED TEST CONNECTOR

CROSS-REFERENCE TO RELATED APPLICATION

This application claims priority to Provisional Application Ser. No. 60/059,305, filed Sep. 17, 1997, entitled ELECTRICALLY HOT MAKE-BREAK SOCKET.

BACKGROUND OF THE INVENTION

1. Field of the Invention

This invention relates to improved test apparatus, in particular to an improvement in a connector utilized in automatic semiconductor testing.

2. Background of the Invention

Delay time in semiconductor testing is an important parameter because of the corresponding reduction in throughput. In typical semiconductor device testers the contact terminals of the tester are maintained at zero electrical potential, i.e. grounded/power-off, when contact is made with the device. This approach eliminates the possibility of applying excessive voltages to the voltage sensitive devices. Unfortunately this approach requires that power must be established and stabilized before testing may commence. This can result in a test delay of tens or even hundreds of milliseconds.

This time delay parameter could be eliminated if an electrically hot make-break contact between the tester and the device under test could be made safely with no injury to the device under test.

SUMMARY OF THE INVENTION

The present invention is an improved semiconductor test connector with different extending contact distances. In the operation of the test apparatus, the test contacts and the Device Under Test (DUT) are brought together at an essentially constant speed along a path generally perpendicular to the contact extensions. The extending contacts are arranged such that they can be deflected inwardly toward the tester by the force applied by a DUT. This results in the contact with the greatest extension connecting first and contacts with smaller extensions making later contact with elements of the DUT. The relative time delays for each contact is essentially proportional to their relative extension with the contacts having the greatest extension making contact first.

The contact with the greatest extension, which makes the first contact with the DUT, is normally grounded to eliminate the possibility of excessive voltages being applied to the semiconductor under test. Electrical hot power or signal connections are made after the ground connection. The result is that electrically hot make-break contacts may be safely made to a DUT with no time delays required to establish test voltage levels.

DESCRIPTION OF THE DRAWINGS

Objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein:

The FIGURE is a side overview of a device under test with elements of a test apparatus and flexible elastomer elements supporting electrical contacts shown in cross-section.

DETAILED DESCRIPTION OF THE INVENTION

The FIGURE shows the overview 10 of a device under test (DUT) 12 and elements of test apparatus 14. Apparatus 14 supports a contact 16 in slot 17 and a contact 18 in slot 19. Elastomer elements 20 and 22, mounted within a side wall of slot 17 extend horizontally across the opening, and elastomer elements 24 and 26, mounted within a side wall of slot 19 extend horizontally across the opening. As shown, elements 20 and 22 support contact 16 and elements 24 and 26 support contact 18. Elements 20, 22, and 24, 26 have the end opposite the mounting end free so they can readily be deformed to permit the ends of respective contacts 16 and 18 to move relative to apparatus 14.

As shown, connector pad 28 supports and engages the lower end of contact 16 and connector pad 30 supports and engages the lower end of contact 18. Pads 22 and 24 are electrically insulated from apparatus 14 with pad 22 being attached to a grounded portion of the test apparatus and pad 24 connected to a test voltage.

Elements of test apparatus 14, have means 11 to hold and move DUT 12 toward contacts 16 and 18 at a predetermined essentially constant velocity in the direction indicated by the arrow labeled V, while maintaining the DUT in the horizontal attitude shown. The downward movement of DUT 12 continues until test points 32 and 34 are immediately adjacent to the lower portion of test apparatus 14. DUT 12 has two test points 32 and 34 provided for electrical tests which are oriented essentially horizontally.

At the beginning of the test cycle DUT 12 is in the location shown and is then moved closer to apparatus 14 in the direction indicated. Since test points 32 and 34 are initially the same distance above apparatus 14, and since contact 16, described here as a Tier 1 contact, extends upward a greater amount than contact 18, described here as a Tier 2 contact, test point 32 will touch contact 16 before test point 34 touches contact 18. Since DUT 12 is being moved closer to the lower portion of apparatus 14 at a predetermined constant velocity, the time between test point 32 touching contact 16 and test point 34 touching contact 18 can be determined by dividing the height difference between contacts 16 and 18 by the velocity that DUT 12 is being moved downward. This arrangement results in a ground potential being connected by contact 16 to test point 32 before a test voltage is connected by contact 18 to test point 34 with the time delay being established by the height differential. As described earlier, this sequence will permit using a hot contact 18 with no injury to voltage sensitive semiconductor circuits. Since the height differential and velocity of movement is designed into test apparatus 14, this time delay can be made any desired value.

When test point 32 reaches contact 16 and continues downward a force will be exerted on the contact and on element 20 through the contact. Elastomer element 20 will then be deformed downward and allow the upper end of contact 16 to move downward. As DUT 12 continues downward element 24 supporting contact 18 will also be deformed downward and provide a predetermined force between test point 34 contact 18. At the same time elements 22 and 26 will be bent upward to provide predetermined forces between pad 28 and contact 16 and between pad 30 and contact 18. This will also rotate the contacts and provide a wiping action between the contacts and their adjacent pads and reduce the electrical resistance. When DUT 12 is finally adjacent to test apparatus 14, the deflection of elements 20, 22, 24 and 26 will provide predetermined forces between test points 16, 18 and respective contacts 16 and 18, and between contacts 16 and 18 and respective pads 28, 30. These predetermined forces are made such that adequate electrical connections between the elements are provided with no injury to the apparatus.

This improvement is particularly adaptable as in improvement to the JohnsTech socket/connector technology. While only two test points are shown here there can be a set consisting of a plurality of such test points for each Tier extension which will be contacted by an equal number of contacts. The only requirement being that the test points for each set are all initially the same distance from opposing connectors. There can be also more than two extension dimensions to provide more than two sets of Tiers of contacts which will allow three or more sequential electrical voltage levels to be applied to the DUT.

While elastomer elements are used here to provide the means to allow the contact ends to move relative to the test apparatus, other mechanical arrangements can be provided to allow similar contact sequences and forces.

While this invention has been described with respect to a specific embodiment, this description is not intended to be construed in a limiting sense. Various modifications of the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed is:

1. An automatic electrical test equipment for providing predetermined test voltages for a device under test including essentially coplanar test points, said test equipment including means for moving a device under test at a predetermined attitude in a direction which is substantially perpendicular to a plane containing said test points and at a predetermined rate, said device under test including test points, each facing, and aligned with, a corresponding test equipment contact, said test equipment further including a corresponding pad engaged by each contact during test to provide a different voltage level to said contacts, comprising:

a) a first elongated contact and a second elongated contact, each elongated contact having a first end and a second end, the second end of each said contact engaging a different test equipment pad, wherein each contact pad has a different voltage, and the first end of said first contact and second contact extending different predetermined distances from said test equipment toward a device under test, the different predetermined distances of the extensions of the first end of said first contact and the first end of said second contact providing a predetermined interval between the time the first end of the first contact and the first end of the second contact are engaged by their respective facing test points; and b) means for supporting said first and second contacts and permitting predetermined forces generated by moving a device under test into engagement with said first ends of said first and second contacts to deflect the first and second ends of said first and second contacts.

2. The improvement of claim 1 having a set of first and a set of second elongated contacts, each contact having a first and a second end, with the second end of each said contact contacting a different test equipment pad, and with the first ends of said first set of contacts extending a first predetermined distance from said test equipment toward the device under test, and the first ends of said second set of contacts extending a second predetermined distance from said test equipment toward the device under test.

3. The improvement of claim 2 having a plurality of sets of contacts with the first ends of each set of contacts extending a predetermined distance from said test equipment toward the device under test with the predetermined distance being different for each said set of contacts.

4. The improvement of claim 2 wherein contact support means comprises:

said test equipment having a slot for each contact arranged such that one opening faces each test point and the opposite opening faces a pad:

said contacts' first and second ends each having generally aligned holes therethrough; and flexible elements extending through each hole in the first and second ends of said contacts having one end of said element anchored within and adjacent to said slot opening such that the ends of said contacts extend outward through the adjacent opening but the elements can be bent under a predetermined force and translate the ends of said contacts within said slot.

5. An automatic electrical test equipment for providing predetermined test voltages for a device under test, said device under test including essentially coplanar test points facing corresponding contacts of the equipment, said test equipment further including a pad engaged by each contact, comprising:

a) a first elongated contact and a second elongated contact, each having a first end and a second end, the second end of said first contact contacting a first test equipment pad having a first voltage and the second end of said second contact contacting a second test equipment pad having a second voltage;

b) means for moving the device under test different predetermined distances such that the first ends of said first and said second contacts are engaged at a time interval; and c) means for supporting said first and second contacts and permitting predetermined forces generated by moving a device under test against said first ends of said first contact and second contact to deflect the first and second ends of said first and second contacts.

* * * * *